United States Patent
Helmick et al.

(10) Patent No.: US 10,770,431 B1
(45) Date of Patent: Sep. 8, 2020

(54) MEMORY DIE LAYOUTS FOR FAILURE PROTECTION IN SSDS

(71) Applicant: Western Digital Technologies, Inc., San Jose, CA (US)

(72) Inventors: Daniel L. Helmick, Broomfield, CO (US); Kent Anderson, Broomfield, CO (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/287,948

(22) Filed: Feb. 27, 2019

(51) Int. Cl.
| | |
|---|---|
| *G11C 5/02* | (2006.01) |
| *H01L 25/065* | (2006.01) |
| *G06F 11/10* | (2006.01) |
| *G11C 16/04* | (2006.01) |

(52) U.S. Cl.
CPC ...... *H01L 25/0655* (2013.01); *G06F 11/1076* (2013.01); *G11C 16/0483* (2013.01)

(58) Field of Classification Search
CPC ............. G11C 16/0483; H01L 25/0655; G06F 11/1076
USPC ........................................................ 365/51
See application file for complete search history.

(56) References Cited

U.S. PATENT DOCUMENTS

| | | | |
|---|---|---|---|
| 2018/0260273 A1* | 9/2018 | Lesartre | G11C 29/52 |
| 2018/0357165 A1 | 12/2018 | Helmick et al. | |
| 2020/0004670 A1* | 1/2020 | Williams | G06F 12/0246 |

* cited by examiner

*Primary Examiner* — Huan Hoang
(74) *Attorney, Agent, or Firm* — Patterson & Sheridan, LLP; Steven Versteeg

(57) ABSTRACT

The present disclosure generally relates to storage devices comprising a memory device having a layout optimized for data failure protection. A storage device comprises a memory device having a first package and a second package disposed adjacent to the first package. The first package comprises an even number of memory die having a first storage capacity, and the second package comprises two memory die having a second storage capacity. A first half of the memory dies of the first package and a first memory die of the second package are coupled to a first channel. A second half of the memory dies of the first package and a second memory die of the second package are coupled to a second channel parallel to the first channel.

20 Claims, 6 Drawing Sheets

MEMORY DIE LAYOUTS FOR FAILURE PROTECTION IN SSDS

BACKGROUND OF THE DISCLOSURE

Field of the Disclosure

Embodiments of the present disclosure generally relate to data storage devices, such as solid state drives (SSDs).

Description of the Related Art

Many storage devices, such as SSDs, utilize both non-volatile memory and volatile memory for storing various types of data. Non-volatile memory devices may be used for storing host data while volatile memory devices may be utilized for storing cached data and/or recovery data. Both the non-volatile memory devices and the volatile memory devices may comprise error correction codes (ECC) for correcting small accumulated errors in the stored data. When the primary ECC codeword correction capabilities are exceeded, the storage device may employ a secondary ECC layer.

However, utilizing both the primary ECC and the secondary ECC may require a large number of memory dies spread over a large number of channels, making packaging of the storage device challenging and expensive. Due to the large number of memory dies and channels, signal integrity and bus speeds may be reduced, and the handling of the memory dies and channels may be difficult. These factors may result in the rebuilding of data using both the primary ECC and the secondary ECC to be complex and time-consuming, increasing the associated latencies of the storage device. As such, rebuilding using both the primary ECC and the secondary ECC may be slow and labor-intensive on the device, causing the failure protection of data to be inefficient.

Thus, there is a need in the art for a storage device having an improved memory device with optimized data failure protection capabilities.

SUMMARY OF THE DISCLOSURE

The present disclosure generally relates to storage devices comprising a memory device having a layout optimized for data failure protection. A storage device comprises a memory device having a first package and a second package disposed adjacent to the first package. The first package comprises an even number of memory dies having a first storage capacity, and the second package comprises two memory dies having a second storage capacity. A first half of the memory dies of the first package and a first memory die of the second package are coupled to a first channel. A second half of the memory dies of the first package and a second memory die of the second package are coupled to a second channel parallel to the first channel.

In one embodiment, a storage device comprises a controller, a first memory device coupled to the controller, the first memory device comprising non-volatile memory, and a second memory device coupled to the controller. The second memory device comprises a first package coupled to a first channel and a second channel parallel to the first channel. The first package comprises an even number of memory dies having a first storage capacity. The second memory device further comprises a second package coupled to the first channel and the second channel. The second package comprises two memory dies having a second storage capacity less than the first storage capacity. An equal number of memory dies from the first package having the first storage capacity and an equal number of memory dies from the second package having the second storage capacity are disposed on both the first channel and the second channel.

In another embodiment, a storage device comprises a first controller, a first memory device coupled to the first controller, the first memory device comprising non-volatile memory, and a second memory device coupled to the first controller. The second memory device comprises a first package comprising an even number of first memory dies. A first half of the first memory dies are disposed parallel to a second half of the first memory dies. The second memory device further comprises a second package disposed adjacent to the first package. The second package comprises a set of second memory dies. A first memory die of the set is disposed adjacent to a second memory die of the set. The second memory device further comprises a first channel coupled to the first half of the first memory dies of the first package and to the first memory die of the set of the second package, and a second channel disposed parallel to the first channel. The second channel is coupled to the second half of the first memory dies of the first package and to the second memory die of the set of the second package.

In another embodiment, a storage device comprises a first memory device comprising a first package comprising an even number of first memory dies. A first half of the first memory dies are disposed parallel to a second half of the first memory dies. The first memory device further comprises a second package disposed adjacent to the first package. The second package comprises a set of second memory dies. A first memory die of the set is disposed adjacent to a second memory die of the set. The first memory device further comprises a first channel coupled to the first half of the first memory dies of the first package and to the first memory die of the set of the second package, and a second channel disposed parallel to the first channel. The second channel is coupled to the second half of the first memory dies of the first package and to the second memory die of the set of the second package. The first memory device further comprises a third package disposed adjacent to the first package, the third package comprising an even number of third memory dies. A first half of the third memory dies are disposed parallel to a second half of the third memory dies. The first memory device further comprises a fourth package disposed adjacent to the third package and the second package, the fourth package comprising a set of fourth memory dies. A first memory die of the set is disposed adjacent to a second memory die of the set. The first memory device further comprises a third channel disposed parallel to the first channel and the second channel, the third channel coupled to the first half of the third memory dies of the third package and to the first memory die of the set of the fourth package, and a fourth channel disposed parallel to the third channel, the fourth channel coupled to the second half of third memory dies of the third package and to the second memory die of the set of the fourth package.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to storage devices comprising a memory device having a layout optimized for data failure protection. A storage device comprises a memory device having a first package and a second package disposed adjacent to the first package. The first package comprises an even number of memory dies having a first storage capacity, and the second package comprises two memory dies having a second storage capacity. A first half of the memory dies of the first package and a first memory die of the second package are coupled to a first channel. A second half of the memory dies of the first package and a second memory die of the second package are coupled to a second channel parallel to the first channel.

Figure 1:
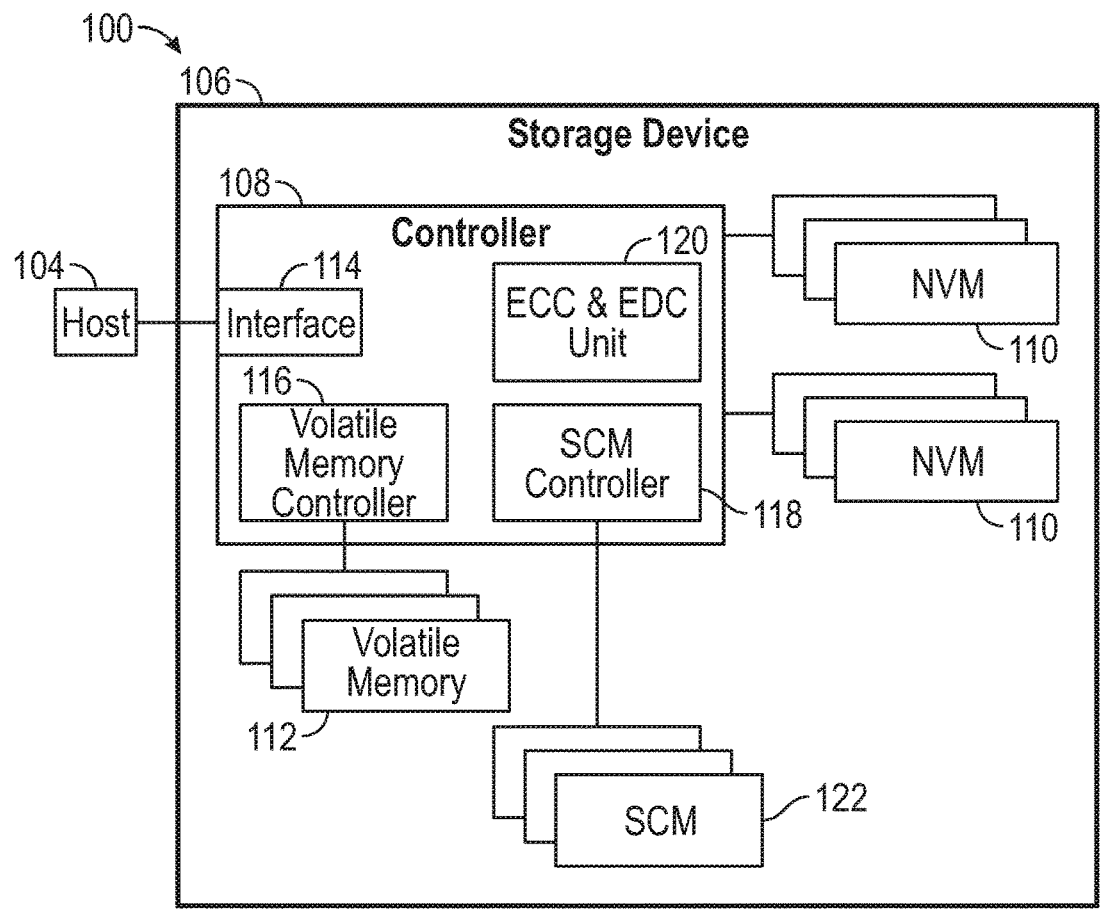
FIG. 1 is a schematic block diagram illustrating a storage system comprising a storage device coupled to a host device, according to one embodiment.

FIG. 1 is a schematic block diagram illustrating a storage system 100 in which storage device 106 may function as a storage device for a host device 104, in accordance with one or more techniques of this disclosure. For instance, the host device 104 may utilize non-volatile memory devices 110 included in storage device 106 to store and retrieve data. In some examples, the storage system 100 may include a plurality of storage devices, such as the storage device 106, which may operate as a storage array. For instance, the storage system 100 may include a plurality of storages devices 106 configured as a redundant array of inexpensive/independent disks (RAID) that collectively function as a mass storage device for the host device 104.

The storage system 100 includes a host device 104 which may store and/or retrieve data to and/or from one or more storage devices, such as the storage device 106. As illustrated in FIG. 1, the host device 104 may communicate with the storage device 106 via a host interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1, the storage device 106 includes a controller 108, non-volatile memory (NVM) 110, volatile memory 112, a volatile memory controller 116, and a host interface 114. While shown in the storage device 106, NVM 110 and volatile memory 112 are optional components, and may not be included in the storage device 106. The storage device 106 further includes a second memory device 122 and a storage class memory (SCM) controller 118 disposed on the controller 108. The second memory device is referred to as an SCM 122. Furthermore, the SCM 122 may replace or supplement any type of memory, such as persistent memory (PM), phase-change memory (PCM) devices, resistive random-access memory (ReRAM) devices, magnetoresistive random-access memory (MRAM) devices, ferroelectric random-access memory (F-RAM), DRAM, SRAM, NAND, NOR, etc.

In some examples, the storage device 106 may include additional components not shown in FIG. 1 for sake of clarity. For example, the storage device 106 may include a printed circuit board (PCB) to which components of the storage device 106 are mechanically attached and which includes electrically conductive traces that electrically interconnect components of the storage device 106, or the like. In some examples, the physical dimensions and connector configurations of the storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the storage device 106 may be directly coupled (e.g., directly soldered) to a motherboard of the host device 104. In one embodiment, the storage device 106 may be a multi-chip package (MCP) comprising several memory devices and controller chips in the same package.

The host interface 114 of the storage device 106 may include one or both of a data bus for exchanging data with the host device 104 and a control bus for exchanging commands with the host device 104. The host interface 114 may operate in accordance with any suitable protocol. For example, the host interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the host interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the host interface 114 may also permit the storage device 106 to receive power from the host device 104.

The storage device 106 includes NVM 110, which may include a plurality of memory devices. NVM 110 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on NVM 110). Memory units may include, but are not limited to: pages, memory divisions, partitions, arrays, planes, blocks, sectors, collections or sets of physical storage locations (e.g., logical pages, logical blocks), or the like.

NVM 110 may be configured to store and/or retrieve data. For instance, a memory device of NVM 110 may receive data and a message from the controller 108 that instructs the memory device to store the data. Similarly, the memory device of NVM 110 may receive a message from the controller 108 that instructs the memory device to retrieve data. In some examples, each of the memory devices may be referred to as a die.

In some examples, each memory device of NVM 110 may include any type of non-volatile memory devices, such as flash memory devices and SCM devices, including PM devices, PCM devices, ReRAM devices, MRAM devices, F-RAM devices, holographic memory devices, and any other type of non-volatile memory devices.

NVM 110 may comprise a plurality of flash memory devices. Flash memory devices may include NAND or NOR based flash memory devices, and may store data based on a charge contained in a floating gate of a transistor for each flash memory cell. In NAND flash memory devices, the flash memory device may be divided into a plurality of blocks which may divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Furthermore, NAND flash memory devices may be 2D or 3D devices, and may be single level cell (SLC), multi-level cell (MLC), triple level cell (TLC), or quad level cell (QLC).

Storage device 106 also includes volatile memory 112, which may be used by controller 108 to store information. The volatile memory controller 116 may manage or control the read and write operations to the volatile memory 112. Volatile memory 112 may be comprised of one or more volatile memory devices. In some examples, the controller 108 may use volatile memory 112 as a cache. For instance, the volatile memory controller 116 may store cached information in volatile memory 112 until cached information is written to NVM 110. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The storage device 106 includes a controller 108, which may manage one or more operations of the storage device 106. For instance, the controller 108 may manage the reading of data from and/or the writing of data to NVM 110. In some embodiments, when the storage device 106 receives a write command from the host device 104, the controller 108 may initiate a data storage command to store data to NVM 110 and monitor the progress of the data storage command. The controller 108 may determine at least one operational characteristic of the storage system 100 and store the at least one operational characteristic to NVM 110. The controller 108 includes an error correction code (ECC) and error detection code (EDC) unit 120. The ECC and EDC unit 120 is configured to detect and receive ECC and recovery data, such as XOR data, parity data, codewords, Bose-Chaudhuri-Hocquenghem (BCH) codes, Low Density Parity Check (LDPC), Cyclical Redundancy Check (CRC), etc. The ECC and EDC unit 120 is further configured to rebuild or recovery failed memory blocks or dies using the ECC and recovery data.

The storage device further includes an SCM 122 and an SCM controller 118 disposed on the controller 108. The SCM 122 may replace or supplement the volatile memory 112. For example, the volatile memory 112 may be utilized for write intensive uses while the SCM 122 may be utilize to storage failure protection data, such as XOR data, parity data, etc. The SCM 122 may be utilized with volatile or non-volatile memory. The SCM controller 118 may manage or controller one or more operations of the SCM 122, such as managing read and write operations to the SCM 122. The SCM controller 118 of the storage device 106 may include one or both of a data bus for exchanging data with the controller 108 and a control bus for exchanging commands with the controller 108.

Figure 2:
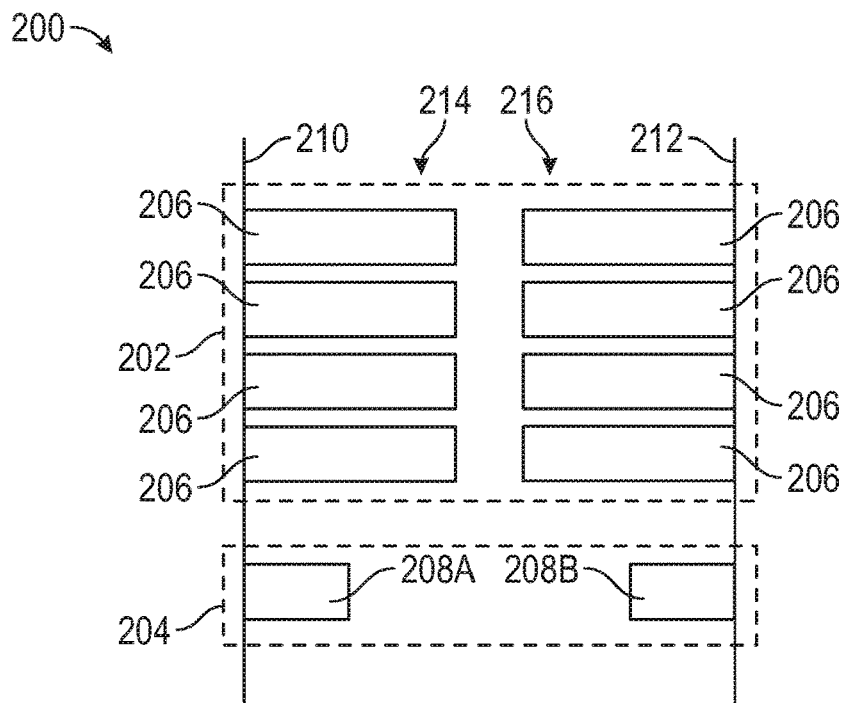
FIG. 2 illustrates an SCM for use in a storage device, according to one embodiment.

FIG. 2 illustrates an SCM 200 utilized in a storage device, such as the storage device 106 of FIG. 1, according to one embodiment. The SCM 200 may be the SCM 122 of FIG. 1. A storage system (e.g., a cellular phone, a Universal Serial Bus (USB), embedded storage devices, etc.) may utilize one or more SCMs 200. The SCM 200 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on the SCM 200).

The SCM 200 comprises a first package 202 and a second package 204 disposed adjacent to the first package 202. The first package 202 comprises an even number of memory dies 206 having a first storage capacity. The first package 202 may comprise may comprise $2^n$ (i.e. a power of two) number of memory dies 206, such as 2, 4, or 8 memory dies 206. The second package 204 comprises a set or pair of memory dies 208A-208B having a second storage capacity.

The first storage capacity of the memory dies 206 of the first package 202 may be greater than the second storage capacity of the memory dies 208A-208B of the second package 204. In one embodiment, the first storage capacity is twice as large as the second storage capacity. For example, the memory dies 206 of the first package 202 may have a storage capacity of 256 Gb while the memory dies 208A-208B of the second package 204 may have a storage capacity of 128 Gb. Thus, in one embodiment, the combined storage capacity of both the memory dies 208A-208B of the second package 204 equals the first storage capacity of one memory die 206 of the first package 202. The memory dies 208A-208B of the second package 204 may be utilized together to service as a single memory die having the first storage capacity. In another embodiment, the first storage capacity is equal to the second storage capacity. For instance, each memory die 206, 208A-208B in both the first package 202 and the second package 204 may have the same storage capacity, such as 256 Gb.

The first package 202 and the second package 204 are coupled to a first channel 210 and a second channel 212 parallel to the first channel 210. The first and second channels 210, 212 may be coupled to an SCM controller, such as the SCM controller 118 of FIG. 1. Utilizing only two channels 210, 212 may increase the bus speed of the SCM interface. The first channel 210 and the second channel 212 may comprise one or more of an open NAND flash interface (ONFI), TM bus, LPDDR3, LPDDR4, DDR2, DDR3, DDR4, or the like.

A first half 214 of the memory dies 206 of the first package 202 and the first memory die 208A of the second package 204 are coupled to the first channel 210. A second half 216 of the memory dies 206 of the first package 202 and the second memory die 208B of the second package 204 are coupled to the second channel 212. As such, both the first channel 210 and the second channel 212 have the same number of memory dies disposed thereon. As shown in FIG. 2, the second package 204 is disposed below the first package 202. However, the second package 204 may be disposed above the first package 202.

In one embodiment, the first package 202 comprises eight memory dies 206 while the second package 204 comprises two memory dies 208A-208B having one-half the storage capacity of the memory dies 206 of the first package 202. Thus, the eight memory dies 206 of the first package 202 combined with the two memory dies 208A-208B of the second package 204 results in the same amount of storage capacity as nine memory dies each having the same storage capacity. Utilizing an even number of memory dies 206 in the first package 202 with the second package 204 having two memory dies 208A-208B with one-half the storage capacity allows each channel 210, 212 to have the same amount of memory dies 206, 208A-208B (i.e., the same total amount of storage capacity) to be disposed thereon. As such, storage devices utilizing the storage capacity of an odd number of memory dies with an even number of channels may be configured such that each channel is coupled to the same amount of memory dies and the same amount of storage capacity.

In one embodiment, only a single memory package having an even number of memory dies disposed on each channel is utilized. For example, a USB device or an embedded device may comprise one memory package having two channels with an even number of die disposed on each channel, such as having five memory dies disposed on each channel. In such an embodiment, each channel may comprise one memory die having the second storage capacity while the other memory dies have the first storage capacity.

Figure 3:
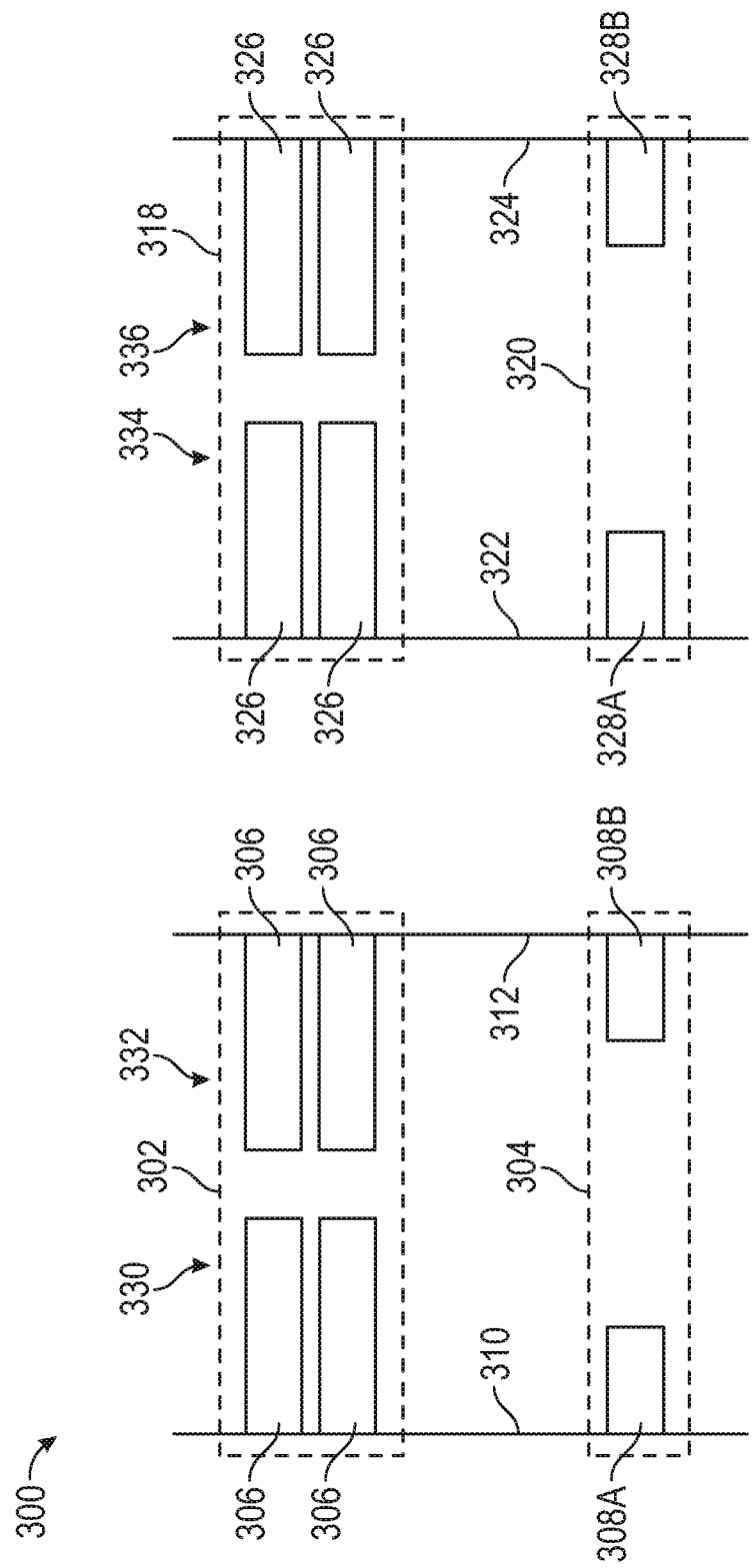
FIG. 3 illustrates an SCM for use in a storage device, according to another embodiment.

FIG. 3 illustrates an SCM 300 utilized in a storage device, such as the storage device 106 of FIG. 1, according to another embodiment. The SCM 300 may be the SCM 122 of FIG. 1. The SCM 300 comprises a first package 302 and a second package 304 disposed adjacent to the first package 302. The first package 302 comprises an even number of memory dies 306 having a first storage capacity. The first package 302 may comprise $2^n$ (i.e. a power of two) number of memory dies 306, such as 2, 4, or 8 memory dies 306. The second package 304 comprises a set or pair of memory dies 308A-308B having a second storage capacity. As shown in FIG. 3, the second package 304 is disposed below the first package 302. However, the second package 304 may be disposed above the first package 302.

The first package 302 and the second package 304 are coupled to a first channel 310 and a second channel 312 parallel to the first channel 310. The first and second channels 310, 312 may be coupled to an SCM controller, such as the SCM controller 118 of FIG. 1. A first half 330 of the memory dies 306 of the first package 302 and the first memory die 308A of the second package 304 are coupled to the first channel 310. A second half 332 of the memory dies 306 of the first package 302 and the second memory die 308B of the second package 304 are coupled to the second channel 312. Thus, the first channel 310 and the second channel 312 each have the same number of memory dies 306, 308A-308B disposed thereon.

The SCM 300 further comprises a third package 318 and a fourth package 320 disposed adjacent to the third package 318. The fourth package 320 is further disposed adjacent to the second package 304, and the third package 318 is disposed adjacent to the first package 302. The third package 318 comprises an even number of memory dies 326 having the first storage capacity. The third package 318 may comprise $2^n$ (i.e. a power of two) number of memory dies 326, such as 2, 4, or 8 memory dies 326. In at least one implementation, the first package 302 and the third package 318 comprise the same number of memory dies 306, 326. The fourth package 320 comprises a set or pair of memory dies 328A-328B having the second storage capacity. The memory dies 308A-308B of the second package 304 and the memory dies 328A-328B of the fourth package 320 may be the same memory dies 208A-208B of the SCM 200 of FIG. 2. As shown in FIG. 3, the fourth package 320 is disposed below the third package 318. However, the fourth package 320 may be disposed above the third package 318. Moreover, the memory dies 306 of the first package 302 and the memory dies 326 of the third package 318 may be the same memory dies 206 of the SCM 200 of FIG. 2.

The third package 318 and the fourth package 320 are coupled to a third channel 322 and a fourth channel 324 parallel to the third channel 318. The third channel 322 and the fourth channel 324 are disposed parallel to the first channel 310 and the second channel 312. The third and fourth channels 322, 324 may be coupled to an SCM controller, such as the SCM controller 118 of FIG. 1. Utilizing only four channels 310, 312, 322, 324 may increase the bus speed of the SCM interface. A first half 334 of the memory dies 326 of the third package 318 and the first memory die 328A of the fourth package 320 are coupled to the third channel 322. A second half 336 of the memory dies 326 of the third package 318 and the second memory die 328B of the fourth package 320 are coupled to the fourth channel 324. Thus, the third channel 322 and the fourth channel 324 each have the same number of memory dies 326, 328A-328B disposed thereon. The first channel 310, the second channel 312, the third channel 322, and the fourth channel 324 may each have the same number of memory dies 306, 308A-308B, 326, 328A-328B disposed thereon.

The first storage capacity of the memory dies 306 of the first package 302 and the memory dies 326 of the third package 318 may be greater than the second storage capacity of the memory dies 308A-308B of the second package 304 and the memory dies 328A-328B of the fourth package 320. In one embodiment, the second storage capacity is one-fourth the size of the first storage capacity. For example, the memory dies 306 of the first package 302 and the memory dies 326 of the third package 318 may have a storage capacity of 256 Gb while the memory dies 308A-308B of the second package 304 and the memory dies 328A-328B of the fourth package 320 may have a storage capacity of 64 Gb. Thus, in one embodiment, the combined storage capacity of the memory dies 308A-308B of the second package 304 and the memory dies 328A-328B of the fourth package 320 equals the first storage capacity of one memory die 306 of the first package 302 or the memory dies 326 of the third package 318. The memory dies 308A-308B, 328A-328B of the second and fourth packages 304, 320 may be utilized together to service as a single memory die having the first storage capacity. In another embodiment, the first storage capacity is equal to the second storage capacity.

In one embodiment, the first package 302 and the third package 318 each comprise four memory dies 306, 326, respectively, and the memory dies 308A-308B, 328A-328B of the second and fourth packages 304, 320 have one-fourth the storage capacity of the memory dies 306, 326 of the first and third packages 302, 318. Thus, the eight total memory dies 306, 326 of the first and third packages 302, 318 combined with the four total memory dies 308A-308B, 328A-328B of the second and fourth packages 304, 320 results in the same amount of storage capacity as nine memory dies each having the same storage capacity. However, by utilizing the memory dies 308A-308B, 328A-328B of the second and fourth packages 304, 320 having a storage capacity one-fourth the size of the first storage capacity of the memory dies 306, 326 of the first and third packages 302, each of the four channels 310, 312, 322, 324 have the same amount of memory dies 306, 308A-308B, 326, 328A-328B (i.e., the same total amount of storage capacity) disposed thereon. As such, storage devices utilizing the storage capacity of an odd number of memory dies with an even number of channels may be configured such that each channel is coupled to the same amount of memory dies and the same amount of storage capacity.

Figure 4:
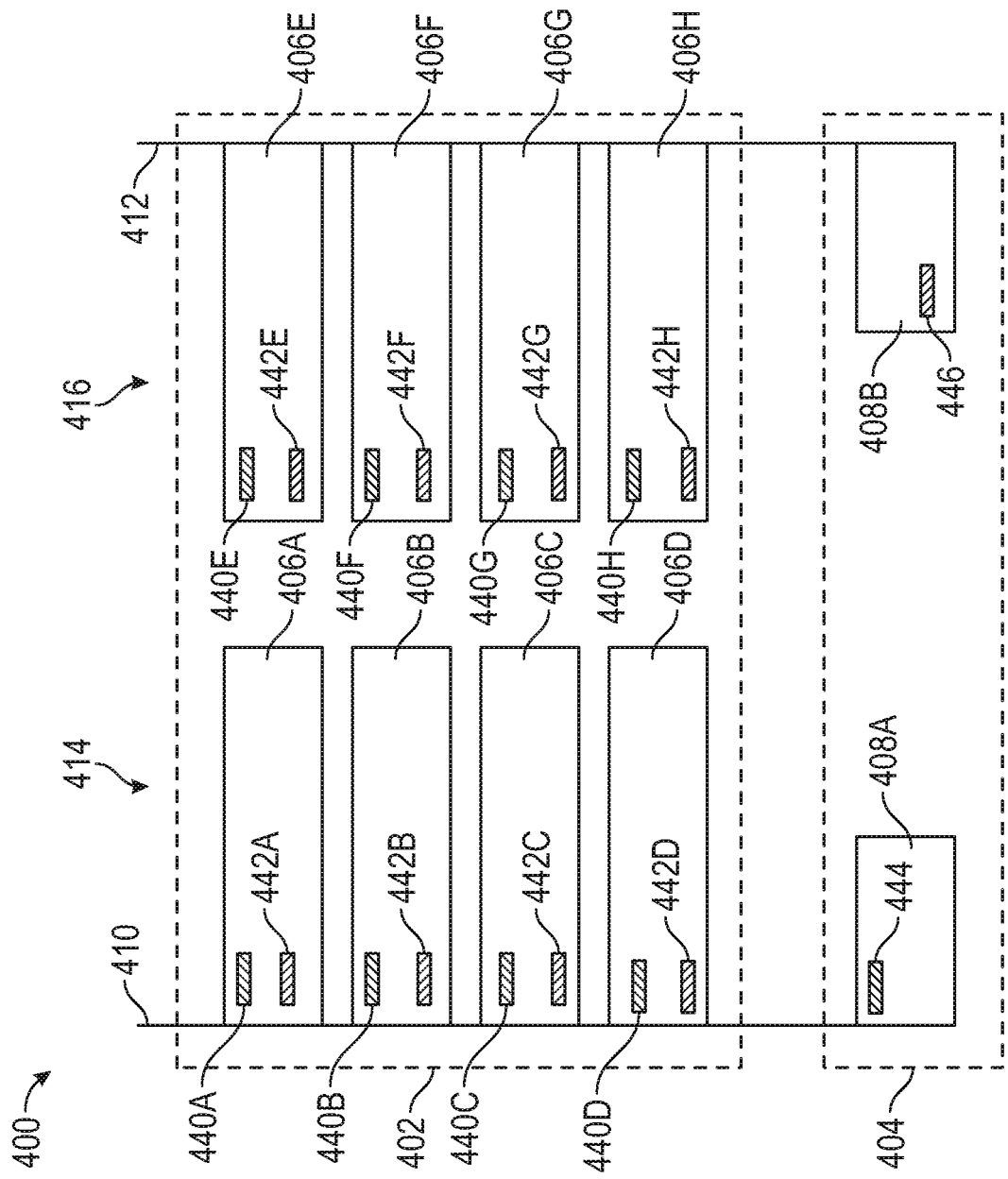
FIG. 4 illustrates the physical placements of data, codewords, and associated parities in an SCM utilized for failure protection in a storage device, according to yet another embodiment.

FIG. 4 illustrates an SCM 400 utilized for failure protection in a storage device, such as the storage device 106 of FIG. 1, according to another embodiment. The SCM 400 may be the SCM 122 of FIG. 1. The SCM 400 is configured like the SCM 200 of FIG. 2. The SCM 400 comprises a first package 402 having an even number of memory dies 406A-406H each having a first storage capacity. A second package 404 disposed adjacent to the first package 402 comprises a set or pair of memory dies 408A-408B each having a second storage capacity. In the embodiment of FIG. 4, the first storage capacity of the memory dies 406A-406H of the first package 402 is twice as large as the second storage capacity of the memory dies 408A-408B of the second package 404. For example, the memory dies 406A-406H of the first package 402 may have a storage capacity of 256 Gb while the memory dies 408A-408B of the second package 404 may have a storage capacity of 128 Gb.

The first package 402 and the second package 404 are coupled to a first channel 410 and a second channel 412 parallel to the first channel 410. The first and second channels 410, 412 may be coupled to an SCM controller, such as the SCM controller 118 of FIG. 1. A first half 414 of the memory dies 406A-406D of the first package 402 and the first memory die 408A of the second package 404 are coupled to the first channel 410. A second half 416 of the memory dies 406E-406H of the first package 402 and the second memory die 408B of the second package 404 are coupled to the second channel 412.

Each memory die 406A-406H in the first package 402 is configured to store first data 440A-440H and second data 442A-442H. In one embodiment, the first data 440A-440H and the second data 442A-442H comprise host data and/or ECC data. The first memory die 408A of the second package 404 is configured to store first recovery data 444 for the first data 440A-440H stored in the memory dies 406A-406H of the first package 402. The second memory die 408B of the second package 404 is configured to store second recovery data 446 for the second data 442A-442H stored in the memory dies 406A-406H of the first package 402. In one embodiment, the first recovery data 444 store XOR data corresponding to the first data 440A-440H, and the second recovery data 446 may store XOR data corresponding to the second data 442A-442H.

The first data 440A-440H and the second data 442A-442H may include one or more types of data, such as logging (e.g. logical-to-physical tables), remapping, ECC, wear leveling, defect growth, etc. The first data 440A-440H and the second data 442A-442H may be the same type of data. The first recovery data 444 and the second recovery data 446 may include one or more types of recovery data, such as XOR data, parity data, codewords, BCH, LDPC, etc. However, because the memory dies 408A-408B of the second package 404 are half the size of the memory dies 406A-406H of the first package 402, recovery data for the memory dies 406A-406H of the first package 402 may be divided to be stored in the second package 404 such that the recovery data 444, 446 is split between the two memory dies 408A-408B of the second package 404. Furthermore, the first data 440A-440H may be stored on the first memory die 408A while the first recovery data 444 may be stored on one of the memory dies 406A-406H, and the second data 442A-442H may be stored on the second memory die 408B while the second recovery data 446 may be stored on one of the memory dies 406A-406H.

In one embodiment, the location of the first recovery data 444 and the second recovery data 446 is rotated between the memory dies 408A-408B of the second package 404 and the memory dies 406A-406H of the first package 402. As described above, the first and second recovery data 444, 446 is stored in the memory dies 408A-408B of the second package 404. However, the first and second recovery data 444, 446 may be stored in the memory die 406A of the first package 402 while the first data 440A and the second data 442A are stored in the first memory die 408A and the second memory die 408B of the second package 404. The first and second recovery data 444, 446 may be stored in any of the memory dies 406A-406H of the first package 402. Thus, storage of the first and second recovery data 444, 446 may be rotated around each of the memory dies 406A-406H of the first package 402 and the memory dies 408A-408B of the second package 404 such that each memory die 406A-406H, 408A-408B stores the first and second recovery data 444, 446 an equal number of times, minimizing the endurance amplification factor and reducing latencies.

Figure 5:
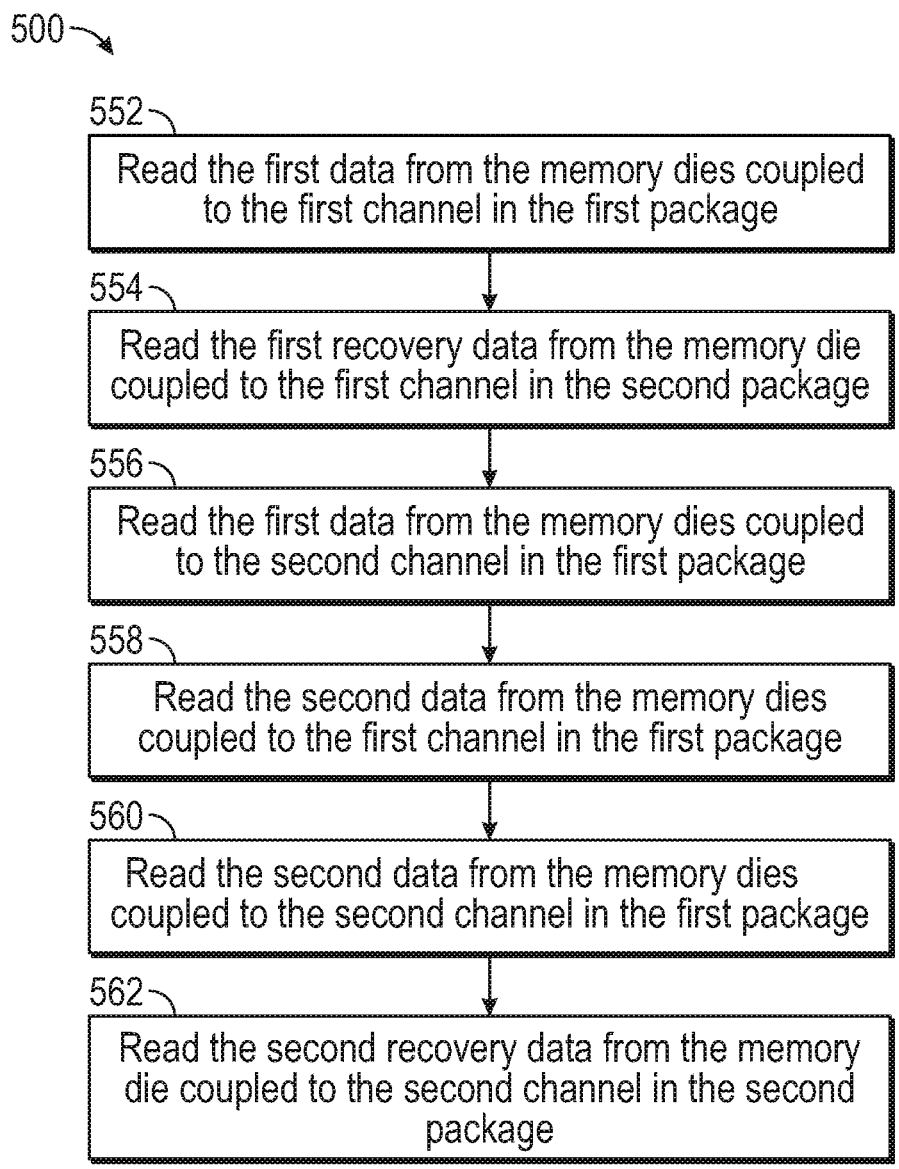
FIG. 5 illustrates a method of recovering data from a failed memory die, according to one embodiment.

FIG. 5 illustrates a method 500 of recovering data from a failed memory die, according to one embodiment. For explanation purposes, FIG. 5 will be described using the SCM 400 of FIG. 4. Furthermore, in the example described in method 500 of FIG. 5, the memory die 406B fails, the first and second data 440A-440H, 442A-442H is stored in the first package 402, and the corresponding recovery data 444, 446 is stored in the second package 404.

To recover or rebuild the failed memory die 406B, the data is read from each functioning memory die 406A, 406C-406H, 408A, 408B in the SCM 400. To recover the first data 440B, the storage device reads the first data 440A, 440C, 440D from the memory dies 406A, 406C, 406D coupled to the first channel 410 in the first package 402 in operation 552. In operation 554, the storage device reads the first recovery data 444 from the first memory die 408A of the second package 404, which is coupled to the first channel 410. In operation 556, the storage device reads the first data 440E-440H from the memory dies 406E-406H coupled to the second channel 412 in the first package 402. Since the second recovery data 446 stored in the second memory die 408B of the second package 404 corresponds to the second data 442B rather than the first data 4408, the second memory die 408B is not read to recover the first data 440B.

To then recover or rebuild the second data 442B, the storage device reads the second data 442A, 442C, 442D from the memory dies 406A, 406C, and 406D coupled to the first channel 410 in the first package 402 in operation 558. In operation 560, the storage device reads the second data 442E-442H from the memory dies 406E-406H coupled to the second channel 412 in the first package 402. In operation 562, the storage device reads the second recovery data 446 from the second memory die 408B of the second package 404, which is coupled to the second channel 412. Since the first recovery data 444 stored in the first memory die 408A of the second package 404 corresponds to the first data 440B rather than the second data 442B, the first memory die 408A is not read to recover the second data 442B.

Once the data stored on the valid memory dies 406A, 406C-406H, 408A, 408B has been read, the read data may be transferred to the controller of the storage device to complete the recovery process of the failed memory die. While method 500 is described as rebuilding the first data 440B prior to rebuilding the second data 442B, the second data 442B may be rebuilt prior to rebuilding the first data 440B. Utilizing method 500 minimizes data recovery or rebuilding times, and further allows for predictable rebuilding times with optimal die overlapping activity. As such, the associated latencies are minimized.

Figure 6:
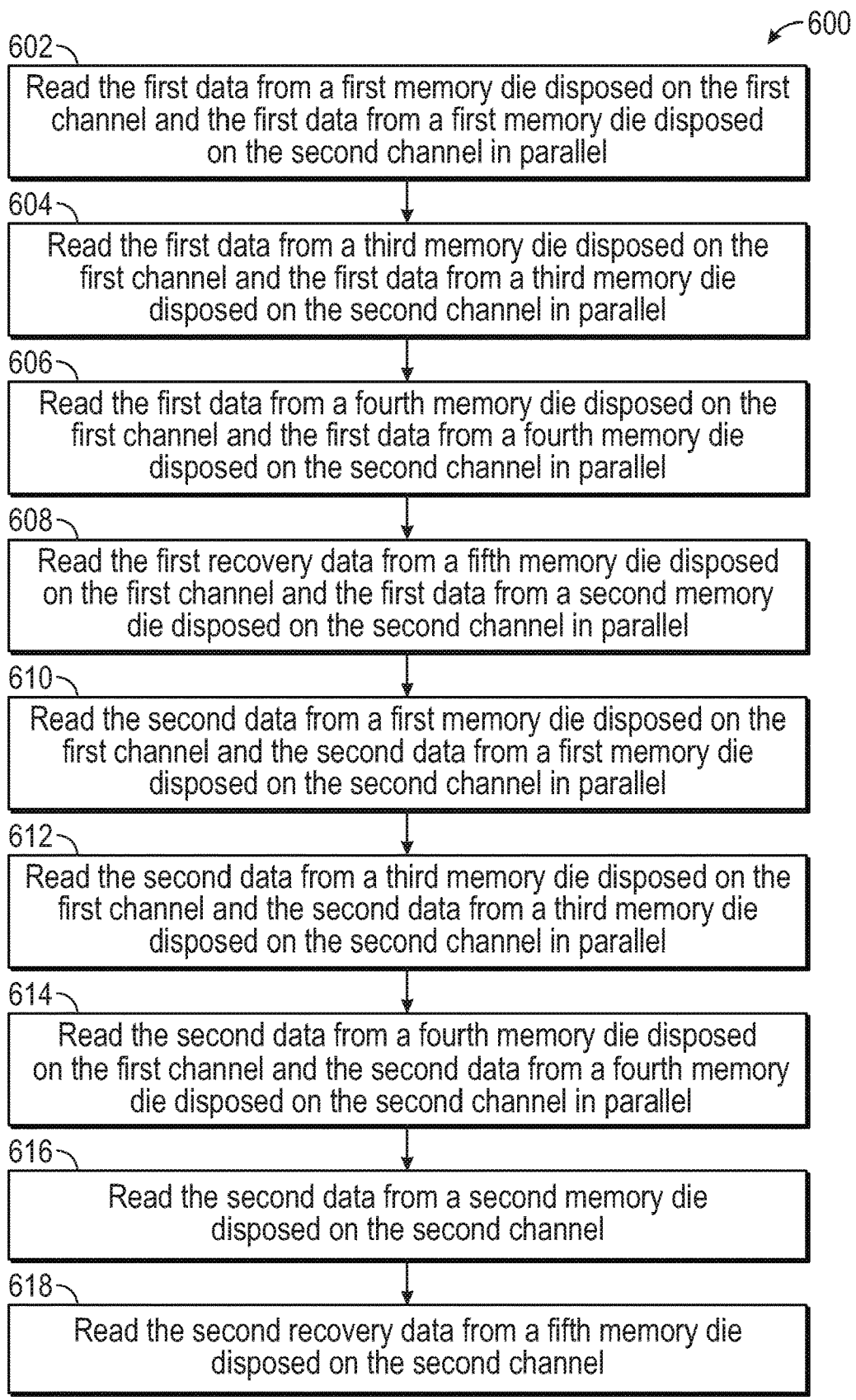
FIG. 6 illustrates a method of recovering data from a failed memory die, according to another embodiment.

FIG. 6 illustrates a method 600 of recovering data from a failed memory die, according to another embodiment. For explanation purposes, FIG. 6 will be described using the SCM 400 of FIG. 4. Furthermore, in the example described in method 600 of FIG. 6, the memory die 406B fails, the first and second data 440A-440H, 442A-442H is stored in the first package 402, and the corresponding recovery data 444, 446 is stored in the second package 404.

To recover or rebuild the failed memory die 406B, the data is read from each functioning memory die 406A, 406C-406H, 408A, 408B in the SCM 400. As shown in the SCM 400 of FIG. 4, the first channel 410 and the second channel 412 are parallel to one another. To recover the first data 440B, the storage device reads the first data 440A from a first memory die 406A disposed on the first channel 410 and the first data 440E from a first memory die 406E disposed on the second channel 412 in parallel in operation 602. The first memory die 406A disposed on the first channel 410 is adjacent to the first memory die 406E disposed on the second channel 412. In operation 604, the storage device reads the first data 440C from a third memory die 406C disposed on the first channel 410 and the first data 440G from a third memory die 406G disposed on the second channel 412 in parallel. The third memory die 406C disposed on the first channel 410 is adjacent to the third memory die 406G disposed on the second channel 412.

In operation 606, the storage device reads the first data 440D from a fourth memory die 406D disposed on the first channel 410 and the first data 440H from a fourth memory die 406H disposed on the second channel 412 in parallel. The fourth memory die 406D disposed on the first channel 410 is adjacent to the fourth memory die 406H disposed on the second channel 412. In operation 608, the storage device reads the first recovery data 444 from a fifth memory die 408A disposed on the first channel 410 and the first data 440F from a second memory die 440F disposed on the second channel 412 in parallel. While the fifth memory die 408A disposed on the first channel 410 and the second memory die 406F disposed on the second channel 412 are not disposed adjacent to one another, the fifth memory die 408A disposed on the first channel 410 and the second memory die 406F disposed on the second channel 412 are disposed on parallel channels, and as such, may be read in parallel.

To recover the second data 442B, the storage device reads the second data 442A from a first memory die 406A disposed on the first channel 410 and the second data 442E from a first memory die 406E disposed on the second channel 412 in parallel in operation 610. In operation 612, the storage device reads the second data 442C from a third memory die 406C disposed on the first channel 410 and the second data 442G from a third memory die 406G disposed on the second channel 412 in parallel.

In operation 614, the storage device reads the second data 442D from a fourth memory die 406D disposed on the first channel 410 and the second data 442H from a fourth memory die 406H disposed on the second channel 412 in parallel. In operation 616, the storage device reads the second data 442F from the second memory die 406F disposed on the second channel 412. In operation 618, the storage device reads the second recovery data 446 from the fifth memory die 408B disposed on the second channel 412.

Because the second recovery data 446 corresponding to the second data 442B is stored in a memory die 408B disposed on the second channel 412, the second memory die 406F also disposed on the second channel 412 and the fifth memory die 408B cannot be read in parallel. As such, recovering the second data 442B of the failed memory die 406B may take between 15-40 ns longer than the recovery of the first data 440B of the failed memory die 406B.

Once the data stored on the valid memory dies 406A, 406C-406H, 408A, 408B has been read, the read data may be transferred to the controller of the storage device to complete the recovery process of the failed memory die. While method 600 is described as rebuilding the first data 440B prior to rebuilding the second data 442B, the second data 442B may be rebuilt prior to rebuilding the first data 440B. Utilizing method 600 minimizes data recovery or rebuilding times, and further allows for predictable rebuilding times with optimal die overlapping activity. As such, the associated latencies are minimized.

Figure 7:
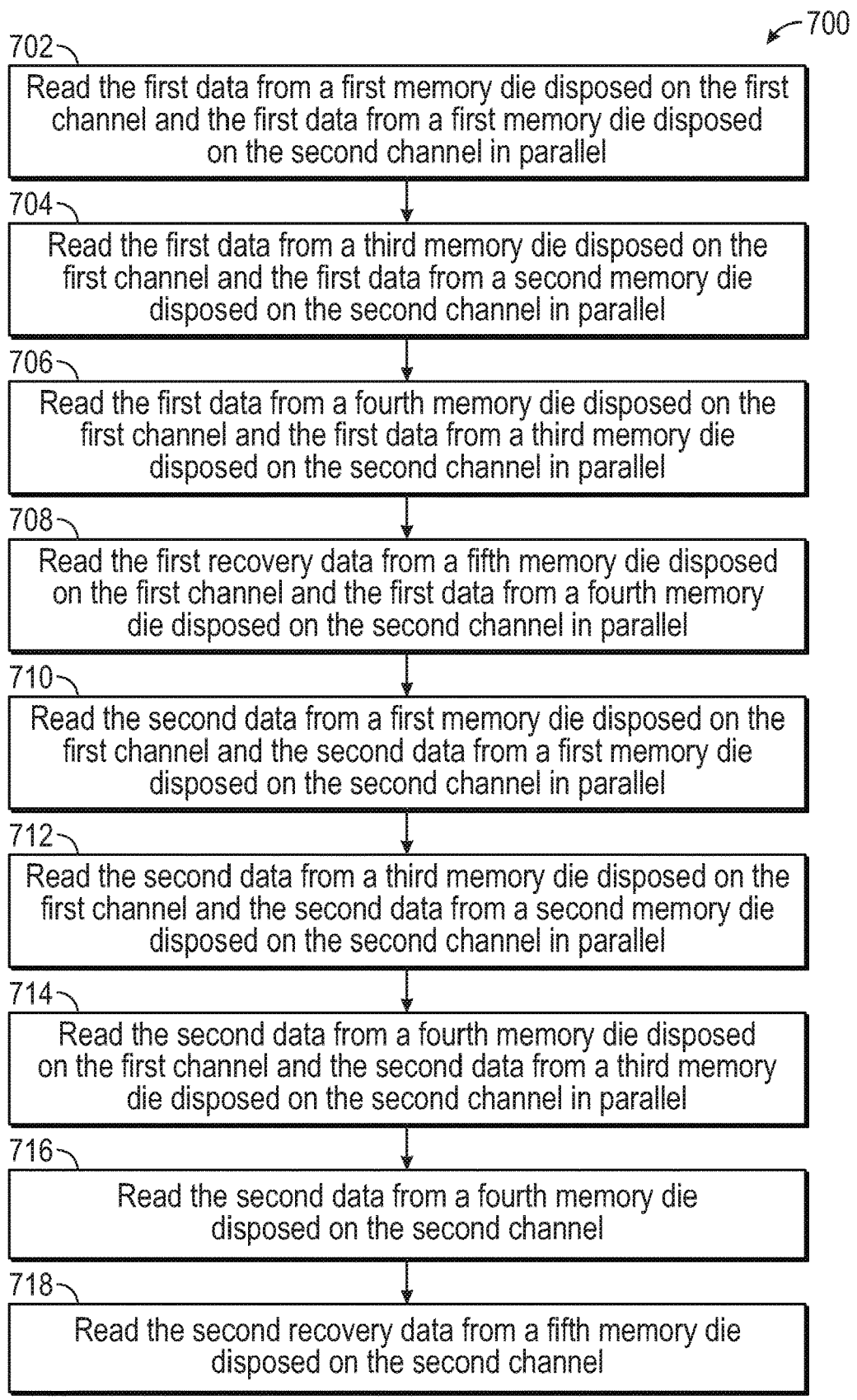
FIG. 7 illustrates a method of recovering data from a failed memory die, according to yet another embodiment.

FIG. 7 illustrates a method 600 of recovering data from a failed memory die, according to another yet embodiment. For explanation purposes, FIG. 7 will be described using the SCM 400 of FIG. 4. Furthermore, in the example described in method 700 of FIG. 7, the memory die 406B fails, the first and second data 440A-440H, 442A-442H is stored in the first package 402, and the corresponding recovery data 444, 446 is stored in the second package 404.

To recover or rebuild the failed memory die 406B, the data is read from each functioning memory die 406A, 406C-406H, 408A, 408B in the SCM 400. As shown in the SCM 400 of FIG. 4, the first channel 410 and the second channel 412 are parallel to one another. To recover the first data 440B, the storage device reads the first data 440A from a first memory die 406A disposed on the first channel 410 and the first data 440E from a first memory die 406E disposed on the second channel 412 in parallel in operation 702. In operation 704, the storage device reads the first data 440C from a third memory die 406C disposed on the first channel 410 and the first data 440G from a second memory die 440F disposed on the second channel 412 in parallel.

In operation 706, the storage device reads the first data 440D from a fourth memory die 406D disposed on the first channel 410 and the first data 440H from a third memory die 406G disposed on the second channel 412 in parallel. In operation 708, the storage device reads the first recovery data 444 from a fifth memory die 408A disposed on the first channel 410 and the first data 440F from a fourth memory die 406H disposed on the second channel 412 in parallel.

To recover the second data 442B, the storage device reads the second data 442A from a first memory die 406A disposed on the first channel 410 and the second data 442E from a first memory die 406E disposed on the second channel 412 in parallel in operation 710. In operation 712, the storage device reads the second data 442C from a third memory die 406C disposed on the first channel 410 and the second data 442G from a second memory die 440F disposed on the second channel 412 in parallel.

In operation 714, the storage device reads the second data 442D from a fourth memory die 406D disposed on the first channel 410 and the second data 442H from a third memory die 406G disposed on the second channel 412 in parallel. In operation 716, the storage device reads the second data 442F from the fourth memory die 406H disposed on the second channel 412. In operation 718, the storage device reads the second recovery data 446 from the fifth memory die 408B disposed on the second channel 412.

Because the second recovery data 446 corresponding to the second data 442B is stored in a memory die 408B disposed on the second channel 412, the second memory die 406F also disposed on the second channel 412 and the fifth memory die 408B cannot be read in parallel. As such, recovering the second data 442B of the failed memory die 406B may take between 15-40 ns longer than the recovery of the first data 440B of the failed memory die 406B.

Once the data stored on the valid memory dies 406A, 406C-406H, 408A, 408B has been read, the read data may be transferred to the controller of the storage device to complete the recovery process of the failed memory die. While method 700 is described as rebuilding the first data 440B prior to rebuilding the second data 442B, the second data 442B may be rebuilt prior to rebuilding the first data 440B. Utilizing method 700 minimizes data recovery or rebuilding times, and further allows for predictable rebuilding times with optimal die overlapping activity. As such, the associated latencies are minimized.

Utilizing an SCM having two or four packages with an equal amount of storage capacity coupled to each channel improves signal integrity and increases bus speeds. Such a symmetric SCM layout allows for easier hardware and algorithm handling of the memory dies and channels, as signal integrity is more similar between the two channels, making PCB routing easier. Furthermore, fewer channels may be utilized, which may reduce the amount of space required for the memory dies in the storage device, allowing for the storage device to have a smaller area and a reduced power usage. Additionally, utilizing an SCM comprising memory dies of varying storage capacities enables manufacturing and packaging costs to be reduced, and allows for the overall read latency of rebuilding failed memory dies to be minimized.

Additionally, the SCM having two or four packages with an even number of memory dies coupled to each channel allows yield fallout to be easily absorbed and for improved recovery of data stored within the memory dies. The parallel access of the channels minimizes data recovery or rebuilding times, and further allows for predictable rebuilding times with optimal die overlapping activity. As such, failure protection of data in storage devices may be improved, as the failed data may be quickly and efficiently rebuilt.

In one embodiment, a storage device comprises a controller, a first memory device coupled to the controller, the first memory device comprising non-volatile memory, and a second memory device coupled to the controller. The second memory device comprises a first package coupled to a first channel and a second channel parallel to the first channel. The first package comprises an even number of memory dies having a first storage capacity. The second memory device further comprises a second package coupled to the first channel and the second channel. The second package comprises two memory dies having a second storage capacity less than the first storage capacity. An equal number of memory dies from the first package having the first storage capacity and an equal number of memory dies from the second package having the second storage capacity are disposed on both the first channel and the second channel.

The second storage capacity may be one-half the first storage capacity. The first package may comprise two, four, or eight memory dies. The second package may be configured to store recovery data for the first package. The storage device may further comprise a third channel disposed parallel to the first channel and the second channel, a fourth channel disposed parallel to the first channel, the second channel, and the third channel, a third package coupled to the third channel and the fourth channel, the third package comprising an even number of memory dies having the first storage capacity, and a fourth package coupled to the first channel and the second channel, the fourth package comprising two memory dies having the second storage capacity. An equal number of memory dies from the third package having the first storage capacity and an equal number of memory dies from the fourth package having the second storage capacity may be disposed on both the third channel and the fourth channel. The second storage capacity may be one-fourth the first storage capacity. The first package and the third package may each comprise the same amount of memory dies.

In another embodiment, a storage device comprises a first controller, a first memory device coupled to the first controller, the first memory device comprising non-volatile memory, and a second memory device coupled to the first controller. The second memory device comprises a first package comprising an even number of first memory dies. A first half of the first memory dies are disposed parallel to a second half of the first memory dies. The second memory device further comprises a second package disposed adjacent to the first package. The second package comprises a set of second memory dies. A first memory die of the set is disposed adjacent to a second memory die of the set. The volatile memory device further comprises a first channel coupled to the first half of the first memory dies of the first package and to the first memory die of the set of the second package, and a second channel disposed parallel to the first channel. The second channel is coupled to the second half of the first memory dies of the first package and to the second memory die of the set of the second package.

The storage device may further comprise a second controller coupled to the first controller. The first controller may be configured to control the first memory device and the second controller may be configured to control the second memory device. The first memory dies may have a first storage capacity, and the set of second memory dies may have a second storage capacity. The second storage capacity may be less than the first storage capacity. The first storage capacity may be twice the second storage capacity. The first memory dies and the second memory dies may have the same storage capacity. The first package may comprises two, four, or eight first memory dies.

In another embodiment, a storage device comprises a first memory device comprising a first package comprising an even number of first memory dies. A first half of the first memory dies are disposed parallel to a second half of the first memory dies. The first memory device further comprises a second package disposed adjacent to the first package. The second package comprises a set of second memory dies. A first memory die of the set is disposed adjacent to a second memory die of the set. The first memory device further comprises a first channel coupled to the first half of the first memory dies of the first package and to the first memory die of the set of the second package, and a second channel disposed parallel to the first channel. The second channel is coupled to the second half of the first memory dies of the first package and to the second memory die of the set of the second package. The first memory device further comprises a third package disposed adjacent to the first package, the third package comprising an even number of third memory dies. A first half of the third memory dies are disposed parallel to a second half of the third memory dies. The first memory device further comprises a fourth package disposed adjacent to the third package and the second package, the fourth package comprising a set of fourth memory dies. A first memory die of the set is disposed adjacent to a second memory die of the set. The first memory device further comprises a third channel disposed parallel to the first channel and the second channel, the third channel coupled to the first half of the third memory dies of the third package and to the first memory die of the set of the fourth package, and a fourth channel disposed parallel to the third channel, the fourth channel coupled to the second half of third memory dies of the third package and to the second memory die of the set of the fourth package.

The first package and the third package may comprise the same amount of memory dies. The first memory dies may have the same storage capacity as the third memory dies, and the second memory dies may have the same storage capacity as the fourth memory dies. The storage capacity of the second memory dies and the fourth memory dies may be one-fourth the storage capacity of the first memory dies and the third memory dies. The second package may be configured to store recovery data for the first package, and the fourth package may be configured to store recovery data for the fourth package.

The storage device may further comprise a first controller coupled to the first memory device and a second memory device coupled to the first controller. The second memory device may comprise non-volatile memory. The first controller may be configured to control the second memory device. The storage device may further comprise a second controller coupled to the first controller and to the first memory device. The second controller may be configured to control the first memory device.

While the foregoing is directed to embodiments of the present disclosure, other and further embodiments of the disclosure may be devised without departing from the basic scope thereof, and the scope thereof is determined by the claims that follow.

What is claimed is:
1. A storage device, comprising:
   a controller;
   a first memory device coupled to the controller, the first memory device comprising non-volatile memory; and
   a second memory device coupled to the controller, the second memory device comprising:
      a first package coupled to a first channel and to a second channel parallel to the first channel, the first package comprising an even number of memory dies each having a first storage capacity; and
      a second package coupled to the first channel and the second channel, the second package comprising two memory dies each having a second storage capacity less than the first storage capacity,
      wherein an equal number of memory dies from the first package having the first storage capacity and an equal number of memory dies from the second package having the second storage capacity are disposed on both the first channel and the second channel.
2. The storage device of claim 1, wherein the second storage capacity of each of the two memory dies is one-half the first storage capacity.
3. The storage device of claim 1, wherein the first package comprises two, four, or eight memory dies.
4. The storage device of claim 1, wherein the second package is configured to store recovery data for the first package.
5. The storage device of claim 1, wherein the second memory device further comprises:
   a third channel disposed parallel to the first channel and the second channel;
   a fourth channel disposed parallel to the first channel, the second channel, and the third channel;
   a third package coupled to the third channel and the fourth channel, the third package comprising an even number of memory dies each having the first storage capacity; and
   a fourth package coupled to the first channel and the second channel, the fourth package comprising two memory dies each having the second storage capacity,
   wherein an equal number of memory dies from the third package having the first storage capacity and an equal number of memory dies from the fourth package having the second storage capacity are disposed on both the third channel and the fourth channel.
6. The storage device of claim 5, wherein the second storage capacity of each of the two memory dies is one-fourth the first storage capacity.
7. The storage device of claim 5, wherein the first package and the third package each comprise the same amount of memory dies.
8. A storage device, comprising:
   a first controller;
   a first memory device coupled to the first controller, the first memory device comprising non-volatile memory; and
   a second memory device coupled to the first controller, the second memory device comprising:
      a first package comprising an even number of first memory dies, wherein a first half of the first memory dies are disposed parallel to a second half of the first memory dies, and wherein each of the first memory dies have a first storage capacity;
      a second package disposed adjacent to the first package, the second package comprising a set of second memory dies, wherein a first memory die of the set of second memory dies is disposed adjacent to a second memory die of the set of second memory dies, and wherein each of the second memory dies have a second storage capacity less than the first storage capacity of the first memory dies;

a first channel coupled to the first half of the first memory dies of the first package and to the first memory die of the set of the second package; and a second channel disposed parallel to the first channel, the second channel coupled to the second half of the first memory dies of the first package and to the second memory die of the set of the second package.

9. The storage device of claim 8, further comprising a second controller coupled to the first controller.

10. The storage device of claim 9, wherein the first controller is configured to control the first memory device and the second controller is configured to control the second memory device.

11. The storage device of claim 8, wherein the first storage capacity of each of the first memory dies is twice the second storage capacity of each of the second memory dies.

12. The storage device of claim 8, wherein the first package comprises two, four, or eight first memory dies.

13. The storage device of claim 8, wherein the second package is configured to store recovery data for the first package.

14. The storage device of claim 8, wherein the second memory dies of the second package are configured to store first data, and wherein a first memory die and a second memory die of the first memory dies of the first package are configured to store recovery data.

15. A storage device, comprising:
a first memory device, comprising:
  a first package comprising an even number of first memory dies, wherein a first half of the first memory dies are disposed parallel to a second half of the first memory dies, and wherein each of the first memory dies have a first storage capacity;
  a second package disposed adjacent to the first package, the second package comprising a set of second memory dies, wherein a first memory die of the set of second memory dies is disposed adjacent to a second memory die of the set of second memory dies, and wherein each of the second memory dies have a second storage capacity less than the first storage capacity of the first memory dies;
  a first channel coupled to the first half of the first memory dies of the first package and to the first memory die of the set of the second package;
  a second channel disposed parallel to the first channel, the second channel coupled to the second half of first memory dies of the first package and to the second memory die of the set of the second package;
  a third package disposed adjacent to the first package, the third package comprising an even number of third memory dies, wherein a first half of the third memory dies are disposed parallel to a second half of the third memory dies, and wherein each of the third memory dies have a third storage capacity;
  a fourth package disposed adjacent to the third package and the second package, the fourth package comprising a set of fourth memory dies, wherein a first memory die of the set of fourth memory dies is disposed adjacent to a second memory die of the set of fourth memory dies, and wherein each of the fourth memory dies have a fourth storage capacity less than the third storage capacity less of the third memory dies;
  a third channel disposed parallel to the first channel and the second channel, the third channel coupled to the first half of the third memory dies of the third package and to the first memory die of the set of the fourth package; and
  a fourth channel disposed parallel to the third channel, the fourth channel coupled to the second half of third memory dies of the third package and to the second memory die of the set of the fourth package.

16. The storage device of claim 15, wherein the first package and the third package comprise the same amount of memory dies.

17. The storage device of claim 15, wherein the first storage capacity of the first memory dies is the same as the third storage capacity of the third memory dies, and wherein the second storage capacity of the second memory dies is the same as the fourth storage capacity of the fourth memory dies.

18. The storage device of claim 17, wherein the second storage capacity of each of the second memory dies and the fourth storage capacity of each of the fourth memory dies is one-fourth the first storage capacity of each of the first memory dies and the third storage capacity of each of third memory dies.

19. The storage device of claim 15, wherein the second package is configured to store recovery data for the first package, and wherein the fourth package is configured to store recovery data for the third package.

20. The storage device of claim 15, further comprising:
a first controller coupled to the first memory device;
a second memory device coupled to the first controller, the second memory device comprising non-volatile memory, wherein the first controller is configured to control the second memory device; and
a second controller coupled to the first controller and to the first memory device, wherein the second controller is configured to control the first memory device.

* * * * *